(12) United States Patent
Kim et al.

(10) Patent No.: US 10,734,416 B2
(45) Date of Patent: Aug. 4, 2020

(54) DISPLAY SUBSTRATE AND METHOD OF MANUFACTURING THE SAME

(71) Applicant: SAMSUNG DISPLAY CO., LTD., Yongin-si, Gyeonggi-do (KR)

(72) Inventors: Hyangyul Kim, Hwaseong-si (KR); Dong-Ju Yang, Seoul (KR)

(73) Assignee: SAMSUNG DISPLAY CO., LTD., Yongin-si. Gyeonggi-Do (KR)

( * ) Notice: Subject to any disclaimer, the term of this patent is extended or adjusted under 35 U.S.C. 154(b) by 0 days.

(21) Appl. No.: 16/439,261

(22) Filed: Jun. 12, 2019

(65) Prior Publication Data

US 2019/0296053 A1 Sep. 26, 2019

Related U.S. Application Data

(62) Division of application No. 15/601,984, filed on May 22, 2017, now Pat. No. 10,355,024.

(30) Foreign Application Priority Data

Jul. 18, 2016 (KR) .......................... 10-2016-0090689

(51) Int. Cl.
*H01L 27/12* (2006.01)
*G02F 1/1362* (2006.01)
*G02F 1/1343* (2006.01)

(52) U.S. Cl.
CPC ...... *H01L 27/124* (2013.01); *G02F 1/136209* (2013.01); *H01L 27/1259* (2013.01); *G02F 2001/134372* (2013.01)

(58) Field of Classification Search
CPC ... G02F 1/136209; G02F 2001/134372; G02F 1/134309; G02F 2001/133618;
(Continued)

(56) References Cited

U.S. PATENT DOCUMENTS 7,879,390 B2 2/2011 Salleo et al.
2011/0049519 A1* 3/2011 Kim ..................... G02F 1/13624
257/59

(Continued)

FOREIGN PATENT DOCUMENTS

KR 10-2016-0053262 5/2016

*Primary Examiner* — Mark W Tornow
*Assistant Examiner* — Priya M Rampersaud
(74) *Attorney, Agent, or Firm* — F. Chau & Associates, LLC

(57) ABSTRACT

A display substrate includes a base substrate with a display area and a light-blocking area around the display area, a switching element disposed on the base substrate that includes a gate electrode electrically connected to a gate line extending in a first direction, a source electrode electrically connected to a data line extending in a second direction crossing the first direction, and a drain electrode spaced apart from the source electrode, a color filter layer disposed on the switching element, a first electrode disposed on the color filter layer, an insulation layer disposed on the first electrode, a second electrode disposed on the insulation layer that includes a slit, a dummy pattern disposed on substantially the same layer as the second electrode that overlaps the data line, and a data light-blocking pattern directly disposed on the dummy pattern that has substantially the same width as the data line.

9 Claims, 15 Drawing Sheets

(58) Field of Classification Search
CPC ... G02F 2001/134381; G02F 2201/123; G02F 2201/40; G02F 1/133514; G02F 1/133516; G02F 1/13394; G02F 1/1368; G02F 2001/133388; G02F 2001/133519; G02F 2001/13398; G02F 2001/134345; G02F 1/136222; G02F 1/13439; G02F 1/136286; G02F 2001/133742; G02F 2001/136218; G02F 1/133707; G02F 1/134336; G02F 1/134363; G02F 2001/136222; G02F 1/136227; G02F 1/133345; G02F 1/136213; G02F 1/133512; G02F 1/133711; G02F 1/1393; G02F 2201/121; G02F 2001/136236; G02F 1/1337; G02F 1/133753; G02F 1/1345; G02F 1/1362; G02F 2001/133397; G02F 2001/133726; G02F 2001/134318; G02F 2001/13606; G02F 2001/136295; G02F 1/13338; G02F 1/133723; G02F 1/1339; G02F 1/13454; G02F 1/13458; G02F 2001/133354; G02F 2001/133746; G02F 1/1334; G02F 1/133555; G02F 1/133784; G02F 1/1341; G02F 1/1343; G02F 1/13452; G02F 1/136204; G02F 2001/133531; G02F 2001/133738; G02F 2001/133749; G02F 2001/133757; G02F 2001/133761; G02F 2001/13396; G02F 2001/13415; G02F 2001/13685; G02F 2001/13793; G02F 2201/122; G02F 2201/48; G02F 2202/42; G02F 1/133788; G02F 1/1306; G02F 2001/13622; G02F 1/13624; G02F 2001/133773; G02F 2001/136231; G02F 2001/13629; G02F 1/1303; G02F 1/1323; G02F 1/1333; G02F 1/13306; G02F 1/133305; H01L 27/124; H01L 27/13; H01L 27/1225; H01L 27/1248; H01L 27/1255; H01L 27/1288; H01L 29/78633; H01L 27/1259; H01L 27/12; H01L 27/1214; H01L 27/2362; H01L 27/3265; H01L 2924/0002; H01L 29/7869; H01L 27/1218; H01L 27/1222; H01L 27/127; H01L 27/3276; H01L 2924/00; H01L 29/4908; H01L 29/66757; H01L 29/66765; H01L 29/786; H01L 29/78621; H01L 29/78636; H01L 29/78669; H01L 21/743; H01L 23/535; H01L 27/088; H01L 27/14603; H01L 27/14692; H01L 27/3244; H01L 27/3248; H01L 27/3258; H01L 27/326; H01L 27/3272; H01L 29/24; H01L 29/66545; H01L 29/66742; H01L 29/66969; H01L 29/7394; H01L 29/78603; H01L 29/78606; H01L 29/78618; H01L 29/78645; H01L 29/78675; H01L 29/78693; H01L 33/08; H01L 33/36; H01L 33/38; H01L 51/5203; H01L 51/5209; G09G 3/3648; G09G 2300/0426; G09G 2300/0434; G09G 2300/0465; G09G 2300/0876; G09G 2320/0219; G09G 3/3614; G02B 5/201

See application file for complete search history.

(56) References Cited

U.S. PATENT DOCUMENTS

| | | | |
|---|---|---|---|
| 2011/0089424 A1* | 4/2011 | Hur | G02F 1/136213 257/59 |
| 2012/0033165 A1* | 2/2012 | Lee | G02F 1/133512 349/110 |
| 2013/0077031 A1* | 3/2013 | Kim | G02F 1/133305 349/106 |
| 2013/0128197 A1* | 5/2013 | Lee | G02B 5/201 349/106 |
| 2015/0103296 A1* | 4/2015 | Kwak | G02F 1/134309 349/106 |
| 2015/0123112 A1* | 5/2015 | Ro | H01L 27/1225 257/43 |
| 2016/0011466 A1* | 1/2016 | Choi | G02F 1/136227 257/72 |
| 2016/0266456 A1 | 9/2016 | Park et al. | |
| 2018/0019284 A1 | 1/2018 | Kim et al. | |

* cited by examiner

DISPLAY SUBSTRATE AND METHOD OF MANUFACTURING THE SAME

CROSS-REFERENCE TO RELATED APPLICATIONS

This application is a divisional of U.S. application Ser. No. 15/601,984, filed on May 22, 2017 in the U.S. Patent and Trademark Office, which in turn claims priority under 35 U.S.C. § 119 from, and the benefit of, Korean Patent Application No. 10-2016-0090689, filed on Jul. 18, 2016 in the Korean Intellectual Property Office (KIPO), the contents of both of which are herein incorporated by reference in their entireties.

BACKGROUND

1. Technical Field

Exemplary embodiments of the present inventive concept are directed to a display substrate and a method of manufacturing the display substrate.

2. Discussion of the Related Art

In general, a liquid crystal display (LCD) panel includes a thin-film transistor substrate, an upper substrate facing the thin-film transistor substrate and a liquid crystal layer disposed between the thin-film transistor substrate and the upper substrate. A thin-film transistor substrate includes a plurality of signal lines and a plurality of thin-film transistors connected to the signal lines.

In general, an LCD panel is driven in a twisted nematic (TN) mode, and recently a plane to line switching (PLS) mode has been used to offer a wide viewing angle.

In PLS mode, a pixel electrode and a common electrode that overlaps the pixel electrode are formed on the thin-film transistor substrate, and an electric field is generated by voltages applied to the pixel electrode and the common electrode. By adjusting an intensity of the electric field, horizontally-arranged liquid crystals rotate so that a desired image may be displayed.

A light-blocking pattern that overlaps a data line is omitted to increase transmittance in PLS mode. However, light reflected by the data line cannot be blocked because of the absence of the light-blocking pattern. Accordingly, defects such as an uneven display due to interference of reflected light may occur.

SUMMARY

Exemplary embodiments of the present inventive concept can provide a display substrate that reduces defects such as an uneven display.

Exemplary embodiments of the present inventive concept can also provide a method of manufacturing a display substrate.

In an exemplary embodiment of the present inventive concept, a display substrate includes a base substrate with a display area and a light-blocking area around the display area, a switching element disposed on the base substrate that includes a gate electrode electrically connected to a gate line that extends in a first direction, a source electrode electrically connected to a data line that extends in a second direction crossing the first direction, and a drain electrode spaced apart from the source electrode, a color filter layer disposed on the switching element, a first electrode disposed on the color filter layer, an insulation layer disposed on the first electrode, a second electrode disposed on the insulation layer that comprises a slit, a dummy pattern disposed on substantially the same layer as the second electrode that overlaps the data line, and a data light-blocking pattern directly disposed on the dummy pattern that has substantially the same width as the data line.

In an exemplary embodiment, the dummy pattern may comprise substantially the same material as the second electrode.

In an exemplary embodiment, a width of the dummy pattern may be less than a width of the data line and a width of the data light-blocking pattern.

In an exemplary embodiment, a width of the dummy pattern may be greater than a width of the data line and a width of the data light-blocking pattern.

In an exemplary embodiment, the display substrate may further comprise a gate light-blocking pattern integrally formed with the data light-blocking pattern that overlaps the gate line, the gate electrode, the source electrode and the drain electrode. The gate electrode may comprise a rectangular-shaped hole totally covered by the drain electrode in a plan view.

In an exemplary embodiment, the display substrate may further comprise a gate metal line disposed on the light-blocking area that is connected to the gate line, and a data metal line disposed on the light-blocking area that is connected to the data line.

In an exemplary embodiment, the display substrate may further comprise a data dummy pattern that partially overlaps the gate metal line and is disposed on substantially the same layer as the data line. The data dummy pattern may totally cover a space between each gate metal line in a plan view.

In an exemplary embodiment, the display substrate may further comprise a gate dummy pattern that partially overlaps the data metal line and is disposed on substantially the same layer as the gate line. The gate dummy pattern may totally cover a space between each data metal line in a plan view.

In an exemplary embodiment, the second electrode may be electrically connected to the drain electrode.

In an exemplary embodiment of the present inventive concept, a method of manufacturing a display substrate includes forming a gate metal pattern on a base substrate, the gate metal pattern including a gate line and a gate electrode, forming a data metal pattern on the base substrate, the data metal pattern including a data line, a source electrode and a drain electrode, forming a color filter layer on the data metal pattern, forming a first electrode on the color filter layer, forming an insulation layer on the first electrode, forming a second electrode and a dummy pattern on the insulation layer, where the second electrode includes a slit and the dummy pattern overlaps the data line, forming a light-blocking layer on the dummy pattern, exposing the light-blocking layer in a direction from the data line to the dummy pattern, and developing the exposed light-blocking layer and forming a light-blocking pattern.

In an exemplary embodiment, the dummy pattern may comprise substantially the same material as the second electrode.

In an exemplary embodiment, a width of the dummy pattern may be less than a width of the data line and a width of the light-blocking pattern.

In an exemplary embodiment, a width of the dummy pattern may be greater than a width of the data line and a width of the light-blocking pattern.

In an exemplary embodiment, the light-blocking layer may comprise a positive photonasty material.

In an exemplary embodiment, forming the gate metal pattern may comprise forming a gate metal line on a light-blocking area of the base substrate, wherein the gate metal line is electrically connected to the gate line, and forming the data metal pattern may comprise forming a data metal line on the light-blocking area of the base substrate, wherein the data metal line is electrically connected to the data line.

In an exemplary embodiment, forming the data metal pattern may comprise forming a data dummy pattern that partially overlaps the gate metal line and is disposed on substantially the same layer as the data line. The data dummy pattern may totally cover a space between each gate metal line in a plan view.

In an exemplary embodiment, forming the gate metal pattern may comprise forming a gate dummy pattern that partially overlaps the data metal line and is disposed on substantially the same layer as the gate line. The gate dummy pattern may totally cover a space between each data metal line in a plan view.

In an exemplary embodiment, the second electrode may be electrically connected to the drain electrode.

In an exemplary embodiment of the present inventive concept, a display substrate includes a base substrate that includes a display area and a light-blocking area around the display area, a switching element disposed on the base substrate that includes a gate electrode electrically connected to a gate line that extends in a first direction, a source electrode electrically connected to a data line that extends in a second direction crossing the first direction, and a drain electrode spaced apart from the source electrode, an insulation layer disposed on the switching element, a second electrode disposed on the insulation layer that comprises a slit that is electrically connected to the drain electrode, a dummy pattern disposed on substantially the same layer as the second electrode and that overlaps the data line, a data light-blocking pattern directly disposed on the dummy pattern that has substantially the same width as the data line, and a gate light-blocking pattern integrally formed with the data light-blocking pattern that overlaps the gate line, the gate electrode, the source electrode and the drain electrode.

In an exemplary embodiment, the display substrate may further comprise a gate metal line disposed on the light-blocking area that is connected to the gate line, a data metal line disposed on the light-blocking area that is connected to the data line, a data dummy pattern that partially overlaps the gate metal line and is disposed on substantially the same layer as the data line, wherein the data dummy pattern totally covers a space between each gate metal line in a plan view, and a gate dummy pattern that partially overlaps the data metal line and is disposed on substantially the same layer as the gate line, wherein the gate dummy pattern totally covers a space between each data metal line in a plan view.

According to a present exemplary embodiment, a display substrate includes a data light-blocking pattern that overlaps a data line. Thus, the defects, such as an uneven display due to interference of light reflected by the data line, can be reduced.

In addition, the data light-blocking pattern includes a positive photonasty material and is formed by a back exposure. Accordingly, a data light-blocking pattern can be formed with substantially the same width as the data line. Thus, defects can be reduced without a loss of transmittance.

DETAILED DESCRIPTION OF EXEMPLARY EMBODIMENTS

Hereinafter, embodiments of the present inventive concept will be explained in detail with reference to the accompanying drawings.

Figure 1:
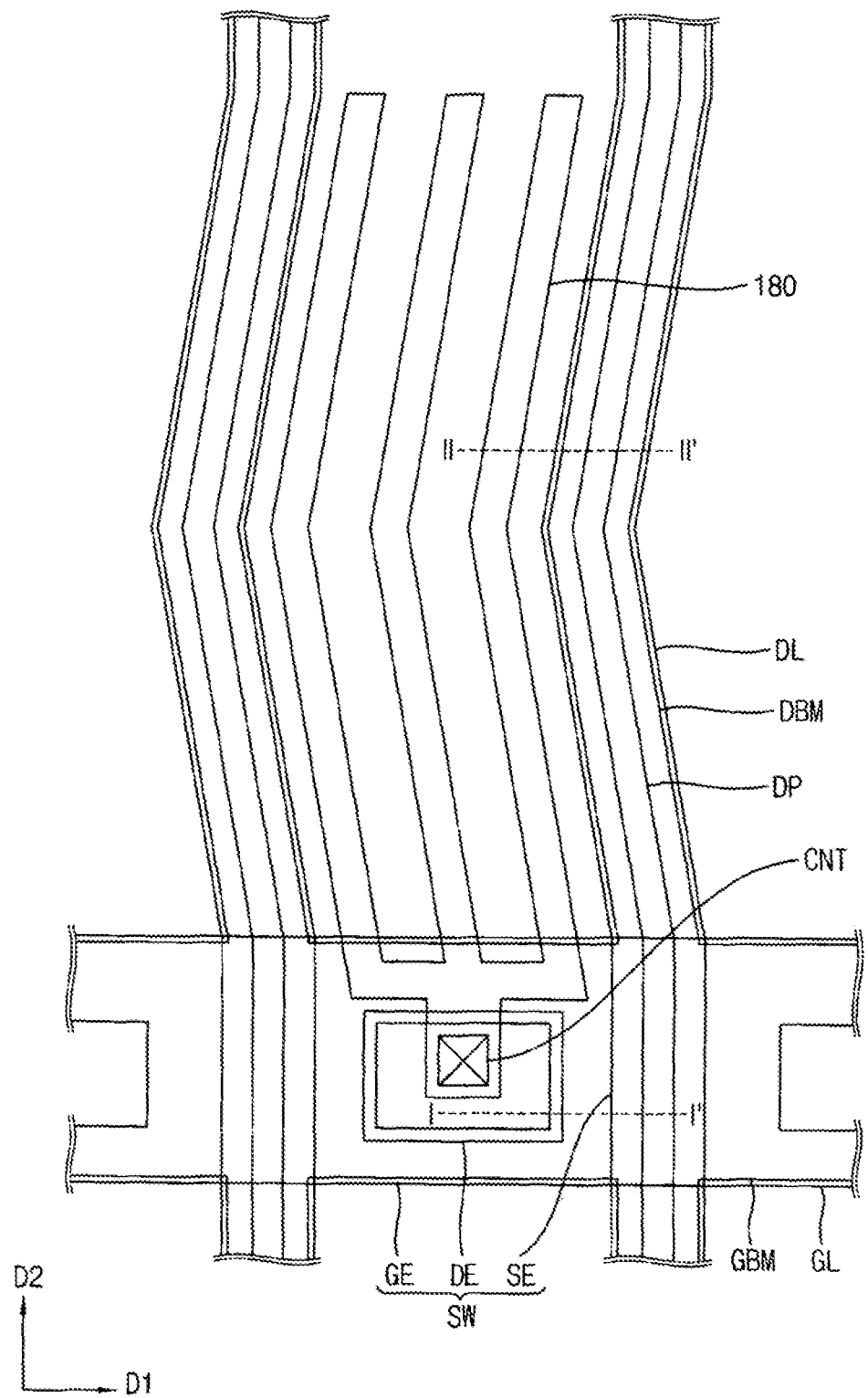
FIG. 1 is a plan view that illustrates a display substrate according to exemplary embodiments of the inventive concept.
Figure 2:
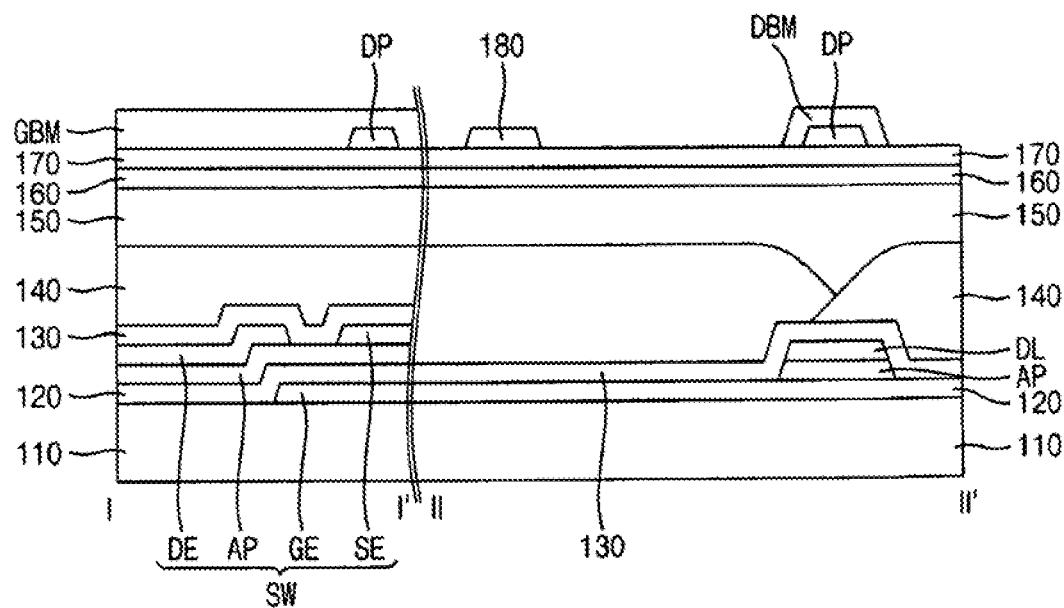
FIG. 2 is a cross-sectional view taken along line I-I' and line II-II' of FIG. 1.

FIG. 1 is a plan view that illustrates a display substrate according to exemplary embodiments of the inventive concept. FIG. 2 is a cross-sectional view taken along line I-I' and line II-II' of FIG. 1.

Referring to FIGS. 1 and 2, a display substrate according to a present exemplary embodiment includes a base substrate 110, a gate metal pattern that includes a gate line GL and a gate electrode GE, a data metal pattern that includes a data line DL, a source electrode SE and a drain electrode DE, a first insulation layer 120, an active pattern AP, a second insulation layer 130, a color filter layer 140, an organic layer 150, a common electrode 160, a third insulation layer 170, a pixel electrode 180, a dummy pattern DP, a gate light-blocking pattern GBM and a data light-blocking pattern DBM. The source electrode SE, drain electrode DE, gate electrode GE and active pattern AP comprise a switching element SW.

According to a present exemplary embodiment, the gate line GL extends in a first direction D1. The gate line GL may have a single layer structure that includes copper (Cu), silver (Ag), chrome (Cr), molybdenum (Mo), aluminum (Al), titanium (Ti), manganese (Mn), or a mixture thereof. Alternatively, the gate line GL may have a multi layer structure having a plurality of metal layers that include different materials. The gate line GL is electrically connected to the gate electrode GE of the switching element SW. A portion of the gate line GL forms the gate electrode GE.

According to a present exemplary embodiment, the first insulation layer 120 is formed on the gate line GL and the gate electrode GE. The first insulation layer 120 includes an inorganic material. For example, the first insulation layer 120 may include silicon oxide (SiOx) and/or silicon nitride (SiNx). For example, the first insulation layer 120 includes silicon oxide (SiOx) and has a thickness of about 500 Å. In addition, the first insulation layer 120 may include a plurality of layers that includes different materials.

According to a present exemplary embodiment, the active pattern AP is formed on the first insulation layer 120. The active pattern AP includes an oxide semiconductor. For example, the oxide semiconductor may include zinc oxide (ZnO), zinc tin oxide (ZTO), zinc indium oxide (ZIO), indium oxide (InO), titanium oxide (TiO), indium gallium zinc oxide (IGZO), indium zinc tin oxide (IZTO), or a mixture thereof. In some embodiments, the oxide semiconductor includes indium gallium zinc oxide.

According to a present exemplary embodiment, the data metal pattern is formed on the active pattern AP. The data metal pattern includes the data line DL, the source electrode SE and the drain electrode DE. The data line DL is electrically connected to the source electrode SE. The data line DL is formed from a same layer from which the source electrode SE and the drain electrode DE are formed. The data line extends in a second direction D2 that crosses the first direction D1.

According to a present exemplary embodiment, the gate electrode GE includes a rectangular-shaped hole CNT. The drain electrode DE is larger than the hole CNT of the gate electrode GE. The drain electrode DE is rectangular-shaped. The drain electrode DE totally overlaps the hole CNT of the gate electrode GE. Thus, the drain electrode DE totally covers the hole CNT in a plan view.

According to a present exemplary embodiment, the second insulation layer 130 is formed on the source electrode SE and the drain electrode DE. The second insulation layer 130 includes an inorganic material. For example, the second insulation layer 130 may include silicon oxide (SiOx) and/or silicon nitride (SiNx). For example, the second insulation layer 130 includes silicon oxide (SiOx) and has a thickness of about 500 Å. In addition, the second insulation layer 130 may have a multi layer structure that includes different materials.

According to a present exemplary embodiment, the color filter layer 140 is formed on the second insulation layer 130. The color filter layer 140 includes a first sub color filter layer, a second sub color filter layer and a third sub color filter layer.

According to a present exemplary embodiment, the first sub color filter layer includes a red material. The second sub color filter layer includes a green material. The third sub color filter layer includes a blue material. The second sub color filter layer is adjacent to the first sub color filter layer. The third sub color filter layer is adjacent to the second sub color filter layer. The first sub color filter layer, the second sub color filter layer and the third sub color filter layer can be sequentially formed to form the color filter layer 140.

According to a present exemplary embodiment, the organic layer 150 is formed on the color filter layer 140. The organic layer 150 planarizes an upper surface of the display substrate to prevent signal lines from being disconnected by bumps on the surface. The organic layer 150 is an insulation layer that includes an organic material.

According to a present exemplary embodiment, the common electrode 160 is formed on the organic layer 150. The common electrode 160 includes a transparent conductive material such as indium tin oxide (ITO) or indium zinc oxide (IZO). In addition, the common electrode 160 may include titanium (Ti) and/or molybdenum titanium (MoTi). A common voltage can be applied to the common electrode 160.

According to a present exemplary embodiment, the third insulation layer 170 is formed on the common electrode 160. The third insulation layer 170 includes an inorganic material such as silicon oxide (SiOx) or silicon nitride (SiNx). For example, the third insulation layer 170 includes silicon oxide (SiOx) and has a thickness of about 500 Å. In addition, the third insulation layer 170 may include a plurality of layers that include different materials.

According to a present exemplary embodiment, the pixel electrode 180 is formed on the third insulation layer 170. The pixel electrode 180 includes a transparent conductive material such as indium tin oxide (ITO) or indium zinc oxide (IZO). In addition, the common electrode 160 may include titanium (Ti) and/or molybdenum titanium (MoTi). The pixel electrode 180 is slit-shaped. The pixel electrode 180 overlaps with the common electrode 160. Thus, by applying an electric field to the pixel electrode 180 and the common electrode 160, horizontally-arranged liquid crystals rotate so that a desired image can be displayed.

According to a present exemplary embodiment, a dummy pattern DP is formed on the third insulation layer 170. The dummy pattern DP overlaps the data line DL. The dummy pattern DP is disposed on a same layer as the pixel electrode 180. The dummy pattern DP includes substantially the same material as the pixel electrode 180. The dummy pattern DP includes a transparent conductive material such as indium tin oxide (ITO) or indium zinc oxide (IZO). In addition, the dummy pattern DP may include titanium (Ti) or molybdenum titanium (MoTi). In a present exemplary embodiment, a width of the dummy pattern DP is less than a width of the data line DL.

According to a present exemplary embodiment, a light-blocking pattern is formed on the base substrate 110 where the pixel electrode 180 and the dummy pattern DP are formed. The light-blocking pattern includes the data light-blocking pattern DBM and the gate light-blocking pattern GBM.

According to a present exemplary embodiment, the data light-blocking pattern DBM is formed directly on the dummy pattern DP. A width of the data light-blocking pattern DBM is substantially the same as the width of the data line DL. The data light-blocking pattern DBM includes a positive photonasty material. The data light-blocking pattern DBM extends in a direction substantially the same as that of the data line DL.

According to a present exemplary embodiment, the gate light-blocking pattern GBM is integrally formed with the data light-blocking pattern DBM. The gate light-blocking pattern GBM overlaps the gate line GL, the gate electrode GE, the source electrode SE and the drain electrode DE. The gate light-blocking pattern GBM includes substantially the same material as the data light-blocking pattern DBM. The gate light-blocking pattern GBM includes a positive photonasty material.

FIGS. 3 to 9 are cross-sectional views that illustrate a method of manufacturing the display substrate of FIG. 2.

Figure 3:
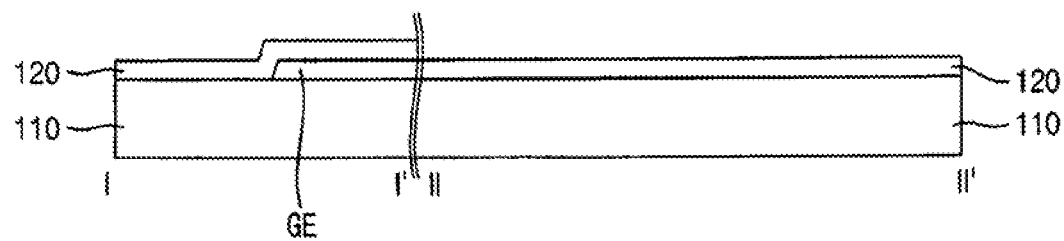
FIGS. 3 to 9 are cross-sectional views that illustrate a method of manufacturing the display substrate of FIG. 2

Referring to FIG. 3, according to a present exemplary embodiment, the gate electrode GE and the first insulation layer 120 are formed on a base substrate 110.

According to a present exemplary embodiment, a gate metal layer is formed on the base substrate 110, and the gate metal layer is patterned to form the gate line GL and the gate electrode GE. A glass substrate, a quartz substrate, a silicon substrate, a plastic substrate, etc., can be used as the base substrate 110.

According to a present exemplary embodiment, the gate metal layer includes copper (Cu), silver (Ag), chrome (Cr), molybdenum (Mo), aluminum (Al), titanium (Ti), manganese (Mn), aluminum (Al), or an alloy thereof. The gate metal layer may have a single layer structure or a multi layer structure with a plurality of different metal layers. For example, the gate metal layer includes a copper layer, and a titanium layer formed on an upper or a lower surface of the copper layer.

Next, according to a present exemplary embodiment, the first insulation layer 120 is formed to cover the gate line GL and the gate electrode GE. The first insulation layer 120 includes one or more of silicon nitride, silicon oxide, etc. The first insulation layer 120 may have a single layer structure or a multi layer structure. For example, the first insulation layer 120 includes a lower insulation layer having silicon nitride and an upper insulation layer having silicon oxide.

Figure 4:
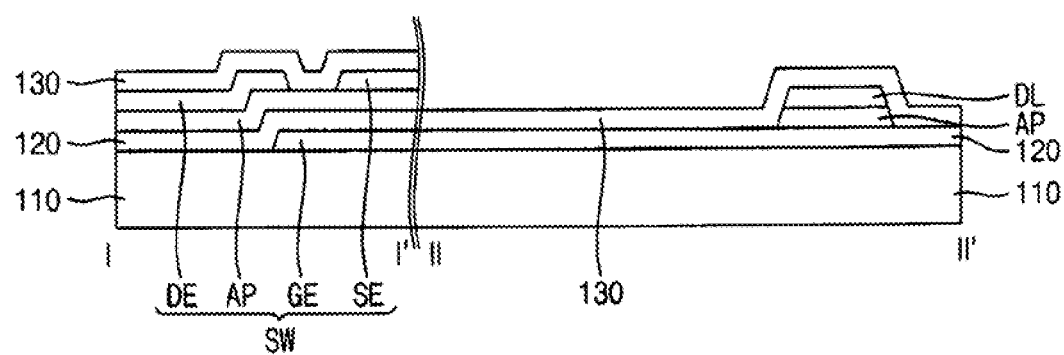

Referring to FIG. 4, according to a present exemplary embodiment, the active pattern AP, the source electrode SE, the drain electrode DE and the second insulation layer 130 are formed on the base substrate 110 on which the first insulation layer 120 is formed.

According to a present exemplary embodiment, the active pattern AP is formed on the first insulation layer 120. The active pattern AP includes an oxide semiconductor. For example, the oxide semiconductor includes zinc oxide (ZnO), zinc tin oxide (ZTO), zinc indium oxide (ZIO), indium oxide (InO), titanium oxide (TiO), indium gallium zinc oxide (IGZO) or indium zinc tin oxide (IZTO), or a mixture thereof. In some embodiments, the oxide semiconductor includes indium gallium zinc oxide.

According to a present exemplary embodiment, the data metal pattern is formed on the active pattern AP. The data metal pattern includes the data line DL, the source electrode SE and the drain electrode DE. The data line DL is electrically connected to the source electrode SE. The data line DL is formed on the layer as the source electrode SE and the drain electrode DE.

According to a present exemplary embodiment, the second insulation layer 130 is formed on the source electrode SE and the drain electrode DE. The second insulation layer 130 includes an inorganic material. For example, the second insulation layer 130 may include silicon oxide (SiOx) or silicon nitride (SiNx). For example, the second insulation layer 130 includes silicon oxide (SiOx) and has a thickness of about 500 Å. In addition, the second insulation layer 130 may have a multi layer structure that includes different materials.

Figure 5:
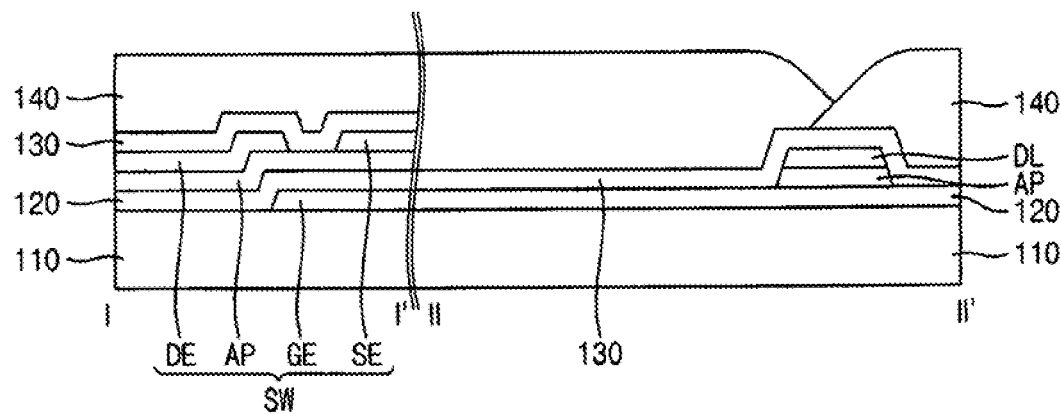

Referring to FIG. 5, according to a present exemplary embodiment, the color filter layer 140 is formed on the base substrate 110 on which the second insulation layer 130 is formed.

According to a present exemplary embodiment, the color filter layer 140 is formed on the second insulation layer 130. The color filter layer 140 includes the first sub color filter layer, the second sub color filter layer and the third sub color filter layer.

According to a present exemplary embodiment, the first sub color filter layer includes a red material. The second sub color filter layer includes a green material. The third sub color filter layer includes a blue material. The second sub color filter layer is adjacent to the first sub color filter layer. The third sub color filter layer is adjacent to the second sub color filter layer. The first sub color filter layer, the second sub color filter layer and the third sub color filter layer are sequentially formed to form the color filter layer 140.

Figure 6:
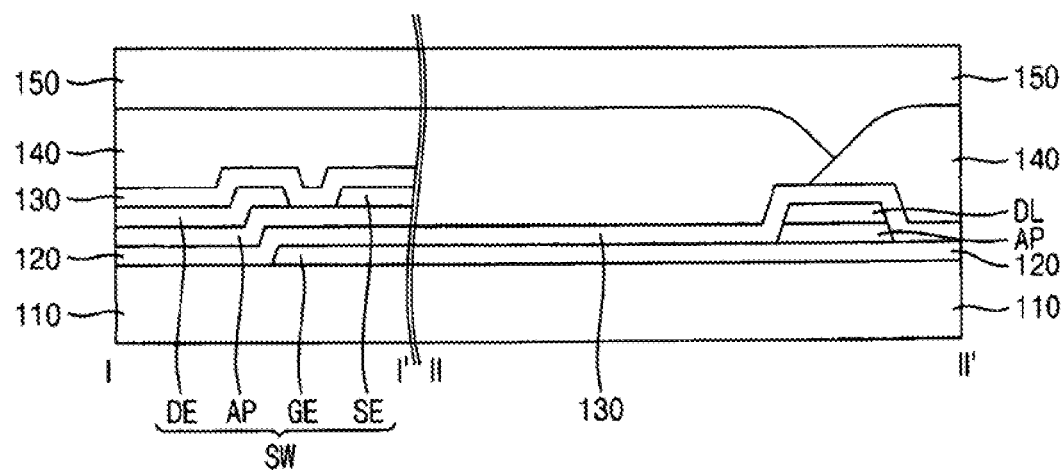

Referring to FIG. 6, according to a present exemplary embodiment, the organic layer 150 is formed on the base substrate 110 on which the color filter layer 140 is formed.

According to a present exemplary embodiment, the organic layer 150 is formed on the color filter layer 140. The organic layer 150 planarizes an upper surface of the display substrate to prevent signal lines from being disconnected by bumps on the surface. The organic layer 150 is an insulation layer that includes an organic material.

Figure 7:
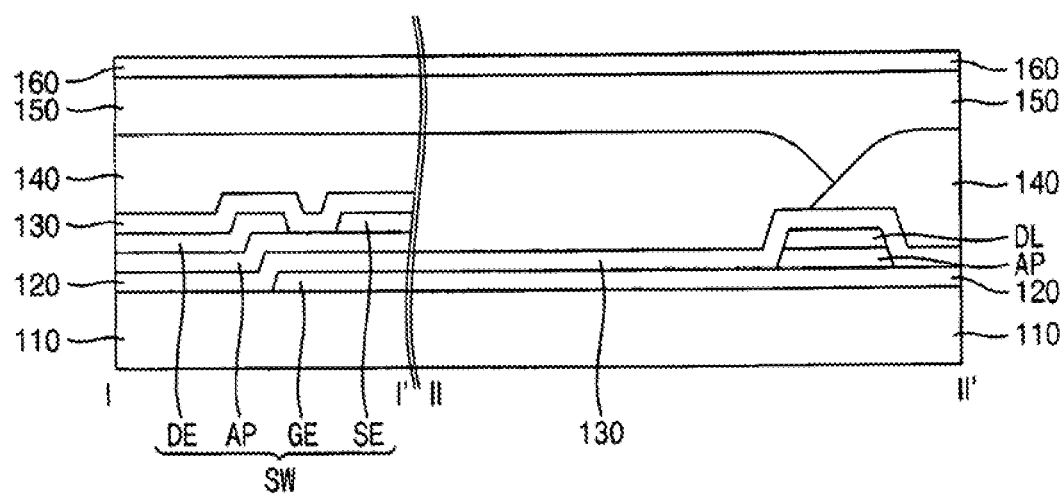

Referring to FIG. 7, according to a present exemplary embodiment, the common electrode 160 is formed on the base substrate 110 on which the organic layer 150 is formed.

According to a present exemplary embodiment, the common electrode 160 is formed on the organic layer 150. The common electrode 160 includes a transparent conductive material such as indium tin oxide (ITO) or indium zinc oxide (IZO). In addition, the common electrode 160 may include titanium (Ti) and/or molybdenum titanium (MoTi). A common voltage can be applied to the common electrode 160.

Figure 8:
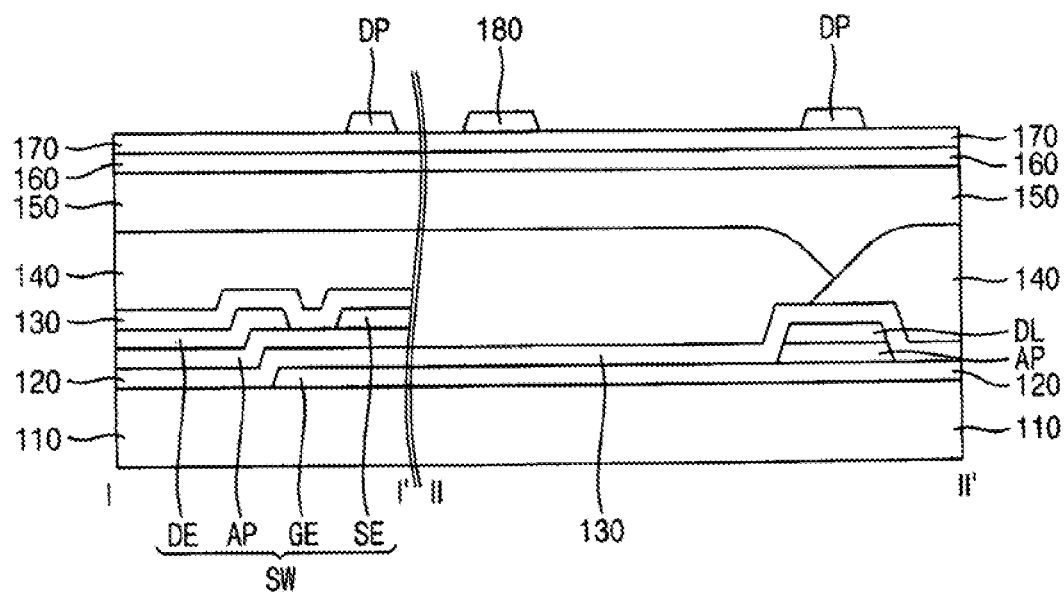

Referring to FIG. 8, according to a present exemplary embodiment, the third insulation layer 170 is formed on the base substrate 110 on which the common electrode 160 is formed. Then, the pixel electrode 180 and the dummy pattern DP are formed on the third insulation layer 170.

According to a present exemplary embodiment, the third insulation layer 170 is formed on the common electrode 160. The third insulation layer 170 includes an inorganic material such as silicon oxide (SiOx) and/or silicon nitride (SiNx). For example, the third insulation layer 170 includes silicon oxide (SiOx) and has a thickness of about 500 Å. In addition, the third insulation layer 170 may include a plurality of layers that include different materials.

According to a present exemplary embodiment, the pixel electrode 180 is formed on the third insulation layer 170. The pixel electrode 180 includes a transparent conductive material such as indium tin oxide (ITO) or indium zinc oxide (IZO). In addition, the pixel electrode 180 may include titanium (Ti) or molybdenum titanium (MoTi). The pixel electrode 180 is slit-shaped. The pixel electrode 180 overlaps the common electrode 160. Thus, by applying an electric field to the pixel electrode 180 and the common electrode 160, horizontally-arranged liquid crystals rotate so that a desired image can be displayed.

According to a present exemplary embodiment, the dummy pattern DP is formed on the third insulation layer 170. The dummy pattern DP overlaps the data line DL. The dummy pattern DP is disposed on a same layer as the pixel electrode 180. The dummy pattern DP includes substantially the same material as the pixel electrode 180. The dummy pattern DP includes a transparent conductive material such as indium tin oxide (ITO) or indium zinc oxide (IZO). In addition, the dummy pattern DP may include titanium (Ti) and/or molybdenum titanium (MoTi). In a present exemplary embodiment, the width of the dummy pattern DP is less than the width of the data line DL.

Figure 9:
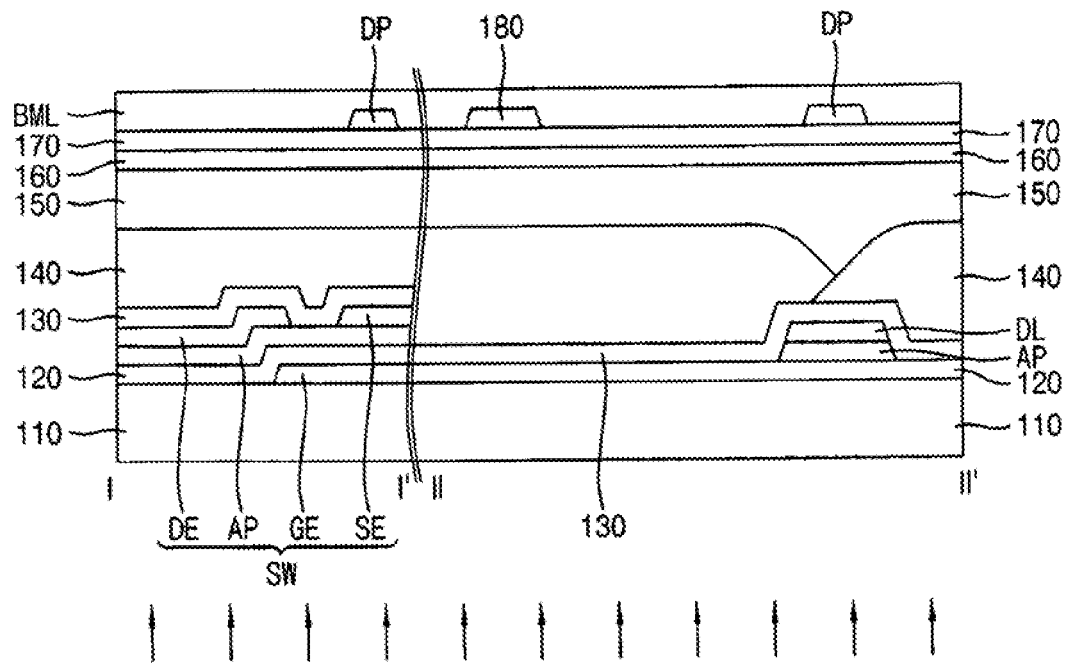

Referring to FIG. 9, according to a present exemplary embodiment, a light-blocking layer BML is formed on the base substrate 110 on which the pixel electrode 180 and the dummy pattern DP are formed. Then, the gate metal pattern and the data metal pattern are used as a mask for a back exposure.

According to a present exemplary embodiment, the light-blocking layer BML includes a positive photonasty material. A positive photonasty material reacts to light so that an exposed area becomes soluble to a developer and a blocked area remains insoluble to the developer. Thus, a portion of the light-blocking layer BML formed on an area which does not overlap the gate metal pattern and the data metal pattern is exposed to be dissolved and removed, and another portion of the light-blocking layer BML formed on an area which overlaps the gate metal pattern and the data metal pattern is not exposed and remains.

Referring to FIG. 2, according to a present exemplary embodiment, a light-blocking pattern is formed by developing the light-blocking layer BML.

According to a present exemplary embodiment, the light-blocking pattern includes the data light-blocking pattern DBM and the gate light-blocking pattern GBM.

According to a present exemplary embodiment, the data light-blocking pattern DBM is formed directly on the dummy pattern DP. The width of the data light-blocking pattern DBM is substantially the same as that of the data line DL. The data light-blocking pattern DBM includes a positive photonasty material. The data light-blocking pattern DBM extends in a direction substantially the same as that of the data line DL.

According to a present exemplary embodiment, the gate light-blocking pattern GBM is integrally formed with the data light-blocking pattern DBM. The gate light-blocking pattern GBM overlaps the gate line GL, the gate electrode GE, the source electrode SE and the drain electrode DE. The gate light-blocking pattern GBM includes a material substantially the same as that of the data light-blocking pattern DBM. The gate light-blocking pattern GBM includes a positive photonasty material.

Figure 10:
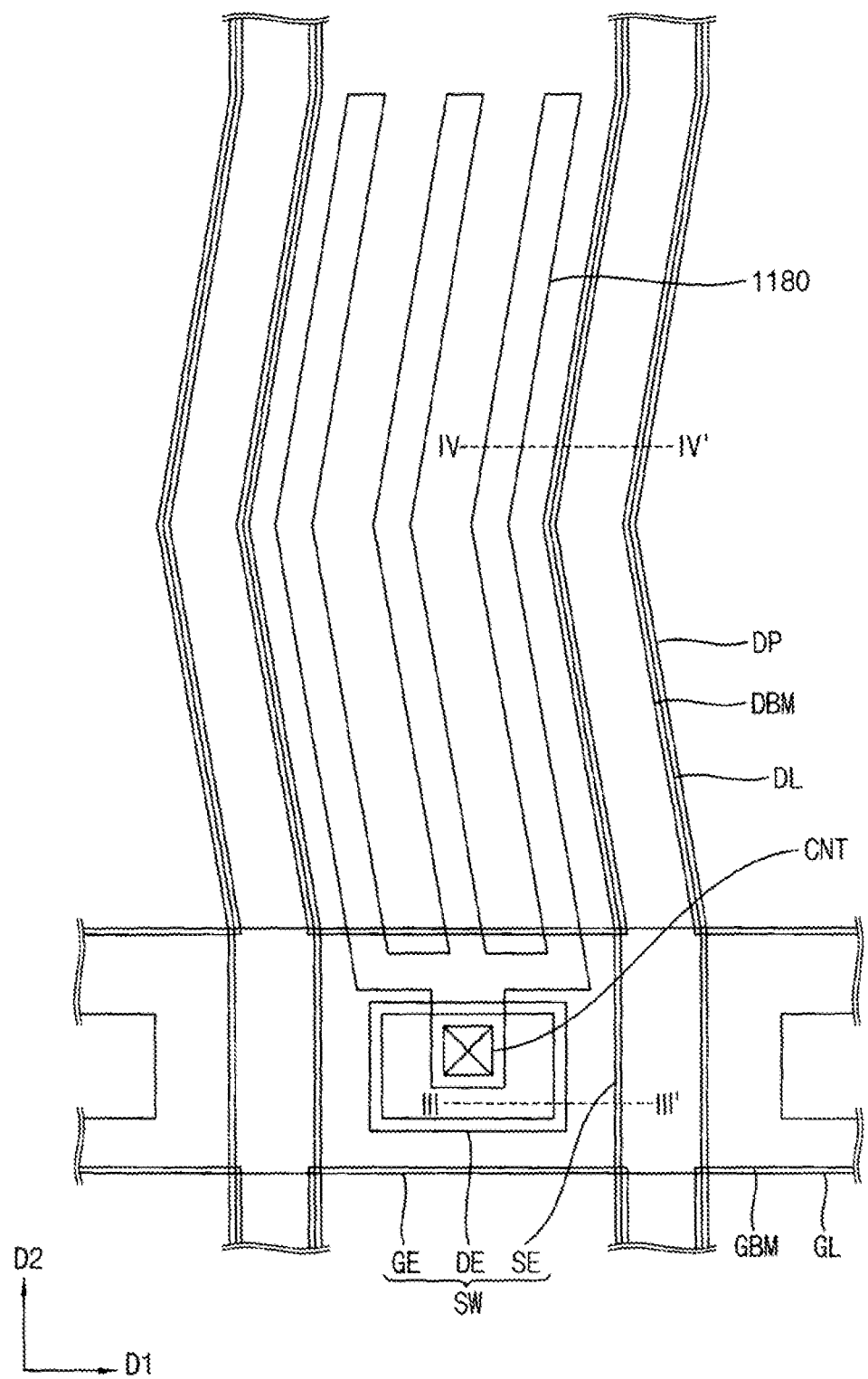
FIG. 10 is a plan view that illustrates a display substrate according to exemplary embodiments of the inventive concept.
Figure 11:
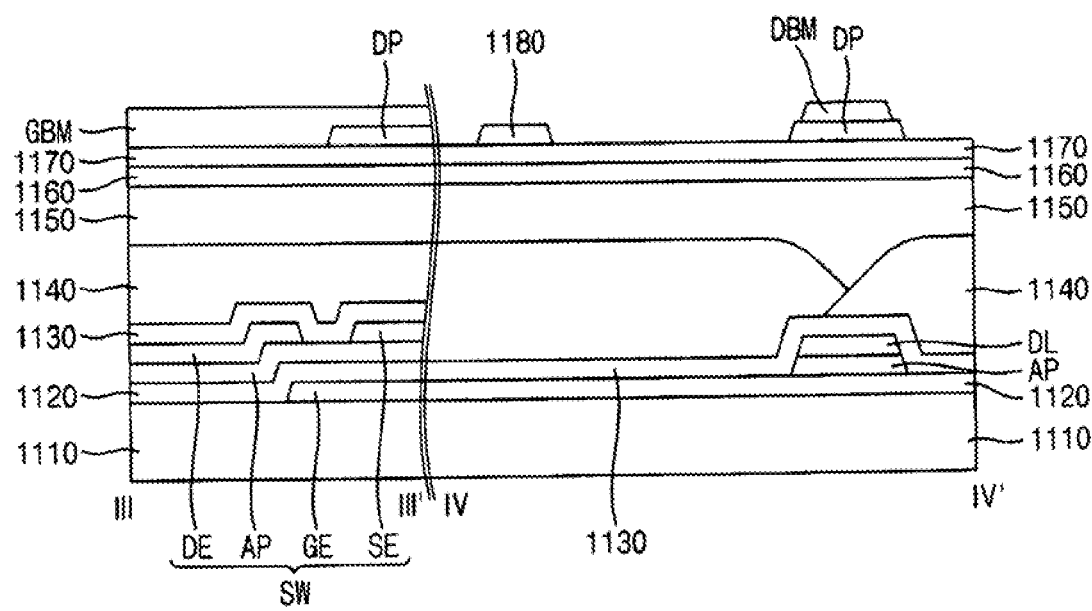
FIG. 11 is a cross-sectional view taken along line III-III' and line IV-IV' of FIG. 10.

FIG. 10 is a plan view that illustrates a display substrate according to exemplary embodiments of the inventive concept. FIG. 11 is a cross-sectional view taken along line III-III' and line IV-IV' of FIG. 10.

According to a present exemplary embodiment, a display substrate according to a present exemplary embodiment is substantially the same as the display substrate of FIGS. 1 and 2 except for a data light-blocking pattern DBM. Thus, the same reference numerals may be used to refer to same or similar parts as those described in the exemplary embodiments of FIGS. 1 and 2 and any further repetitive explanation concerning the above elements may be omitted.

Referring to FIGS. 10 and 11, according to a present exemplary embodiment, a display substrate according to a present exemplary embodiment includes a base substrate 1110, a gate metal pattern that includes a gate line GL and a gate electrode GE, a data metal pattern that includes a data line DL, a source electrode SE and a drain electrode DE, a first insulation layer 1120, an active pattern AP, a second insulation layer 1130, a color filter layer 1140, an organic layer 1150, a common electrode 1160, a third insulation layer 1170, a pixel electrode 1180, a dummy pattern DP, a gate light-blocking pattern GBM and a data light-blocking pattern DBM. The source electrode SE, drain electrode DE, gate electrode GE and active pattern AP comprise a switching element SW.

According to a present exemplary embodiment, a dummy pattern DP is formed on the third insulation layer 1170. The dummy pattern DP overlaps the data line DL. The dummy pattern DP is disposed on a same layer as the pixel electrode 1180. The dummy pattern DP includes substantially the same material as the pixel electrode 1180. The dummy pattern DP includes a transparent conductive material such as indium tin oxide (ITO) or indium zinc oxide (IZO). In addition, the dummy pattern DP may include titanium (Ti) and/or molybdenum titanium (MoTi). In a present exemplary embodiment, a width of the dummy pattern DP is greater than a width of the data line DL.

FIGS. 12 to 18 are cross-sectional views that illustrate a method of manufacturing the display substrate of FIG. 11.

Figure 12:
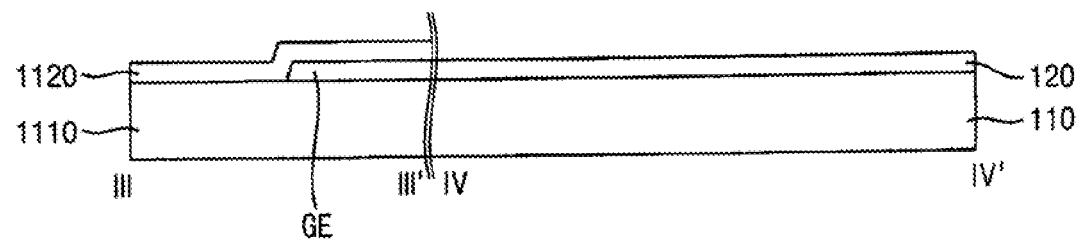
FIGS. 12 to 18 are cross-sectional views that illustrate a method of manufacturing the display substrate of FIG. 11.

Referring to FIG. 12, according to a present exemplary embodiment, the gate electrode GE and the first insulation layer 1120 are formed on the base substrate 1110.

According to a present exemplary embodiment, a gate metal layer is formed on the base substrate 1110, and the gate metal layer is patterned to form the gate line GL and the gate electrode GE. A glass substrate, a quartz substrate, a silicon substrate, a plastic substrate, etc., can be used as the base substrate 1110.

According to a present exemplary embodiment, the gate metal layer includes copper (Cu), silver (Ag), chrome (Cr), molybdenum (Mo), aluminum (Al), titanium (Ti), manganese (Mn), aluminum (Al), or an alloy thereof. The gate metal layer may have a single layer structure or a multi layer structure having a plurality of different metal layers. For example, the gate metal layer includes a copper layer and a titanium layer formed on an upper or lower surface of the copper layer.

Next, according to a present exemplary embodiment, the first insulation layer 1120 is formed to cover the gate line GL and the gate electrode GE. The first insulation layer 1120 includes silicon nitride, silicon oxide, etc. The first insulation layer 1120 may have a single layer structure or a multi layer structure. For example, the first insulation layer 1120 includes a lower insulation layer having silicon nitride and an upper insulation layer having silicon oxide.

Figure 13:
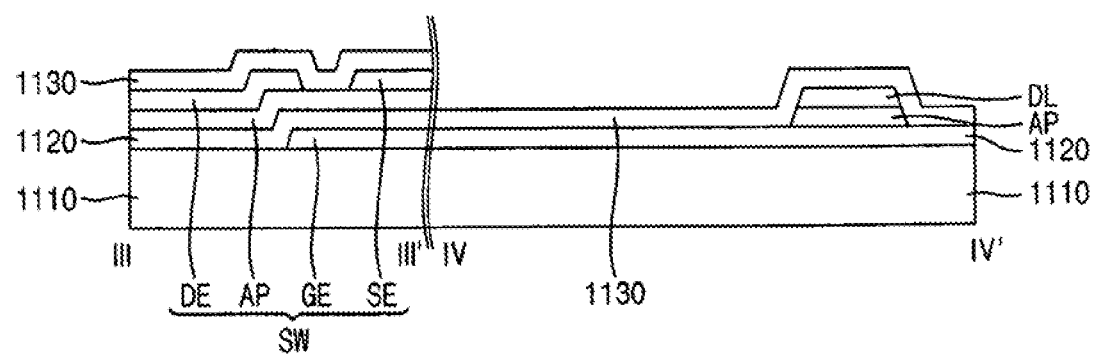

Referring to FIG. 13, according to a present exemplary embodiment, the active pattern AP, the source electrode SE, the drain electrode DE and the second insulation layer 1130 are formed on the base substrate 1110 on which the first insulation layer 1120 is formed.

According to a present exemplary embodiment, the active pattern AP is formed on the first insulation layer 1120. The active pattern AP includes an oxide semiconductor. For example, the oxide semiconductor includes zinc oxide (ZnO), zinc tin oxide (ZTO), zinc indium oxide (ZIO), indium oxide (InO), titanium oxide (TiO), indium gallium zinc oxide (IGZO), indium zinc tin oxide (IZTO) or a mixture thereof. In some embodiments, the oxide semiconductor includes indium gallium zinc oxide.

According to a present exemplary embodiment, the data metal pattern is formed on the active pattern AP. The data metal pattern includes the data line DL, the source electrode SE and the drain electrode DE. The data line DL is electrically connected to the source electrode SE. The data line DL is formed from a same layer as the source electrode SE and the drain electrode DE.

According to a present exemplary embodiment, the second insulation layer 1130 is formed on the source electrode SE and the drain electrode DE. The second insulation layer 1130 includes an inorganic material. For example, the second insulation layer 1130 may include silicon oxide (SiOx) or silicon nitride (SiNx). For example, the second insulation layer 1130 includes silicon oxide (SiOx) and has a thickness of about 500 Å. In addition, the second insulation layer 1130 may have a multi layer structure that including different materials.

Figure 14:
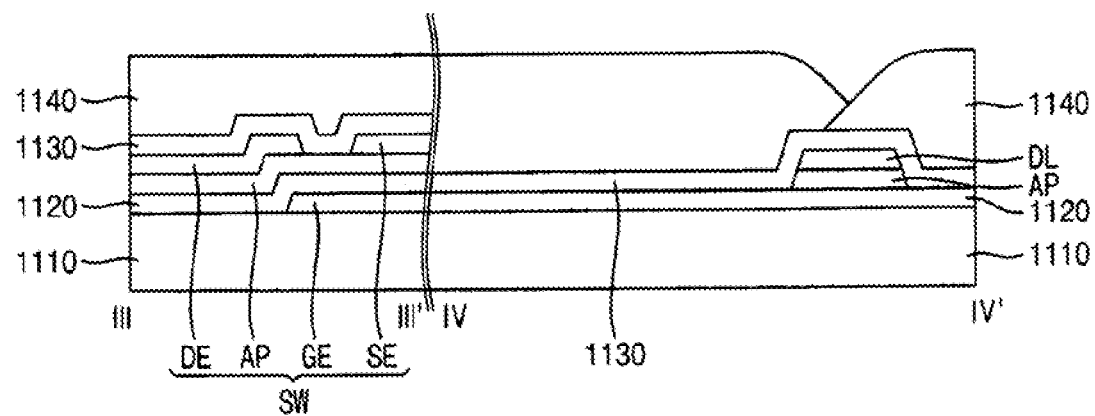

Referring to FIG. 14, according to a present exemplary embodiment, the color filter layer 1140 is formed on the base substrate 1110 on which the second insulation layer 1130 is formed.

According to a present exemplary embodiment, the color filter layer 1140 is formed on the second insulation layer 1130. The color filter layer 1140 includes the first sub color filter layer, the second sub color filter layer and the third sub color filter layer.

According to a present exemplary embodiment, the first sub color filter layer includes a red material. The second sub color filter layer includes a green material. The third sub color filter layer includes a blue material. The second sub color filter layer is adjacent to the first sub color filter layer. The third sub color filter layer is adjacent to the second sub color filter layer. The first sub color filter layer, the second sub color filter layer and the third sub color filter layer can be sequentially formed to form the color filter layer 1140.

Figure 15:
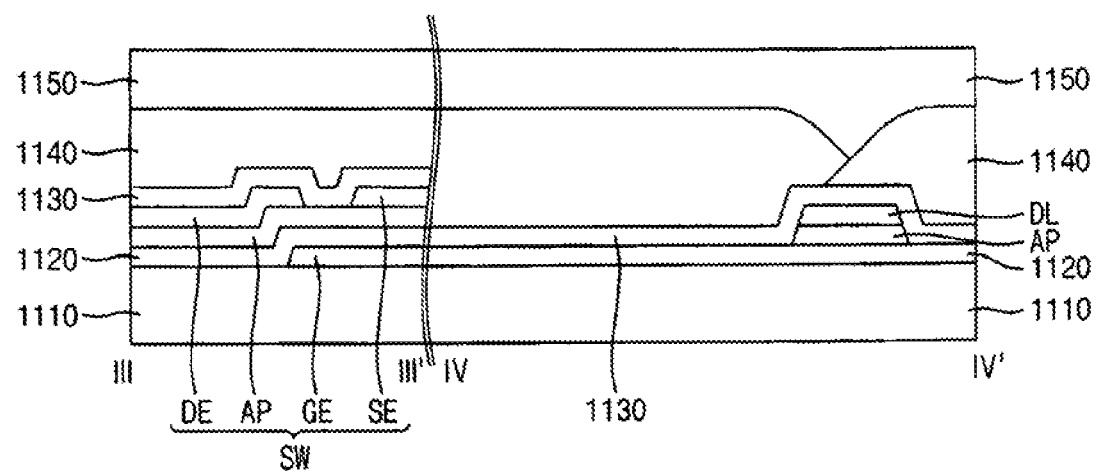

Referring to FIG. 15, according to a present exemplary embodiment, the organic layer 1150 is formed on the base substrate 1110 on which the color filter layer 1140 is formed.

According to a present exemplary embodiment, the organic layer 1150 is formed on the color filter layer 1140. The organic layer 1150 planarizes an upper surface of the display substrate to prevent signal lines from being disconnected by bumps on the surface. The organic layer 1150 is an insulation layer that includes an organic material.

Figure 16:
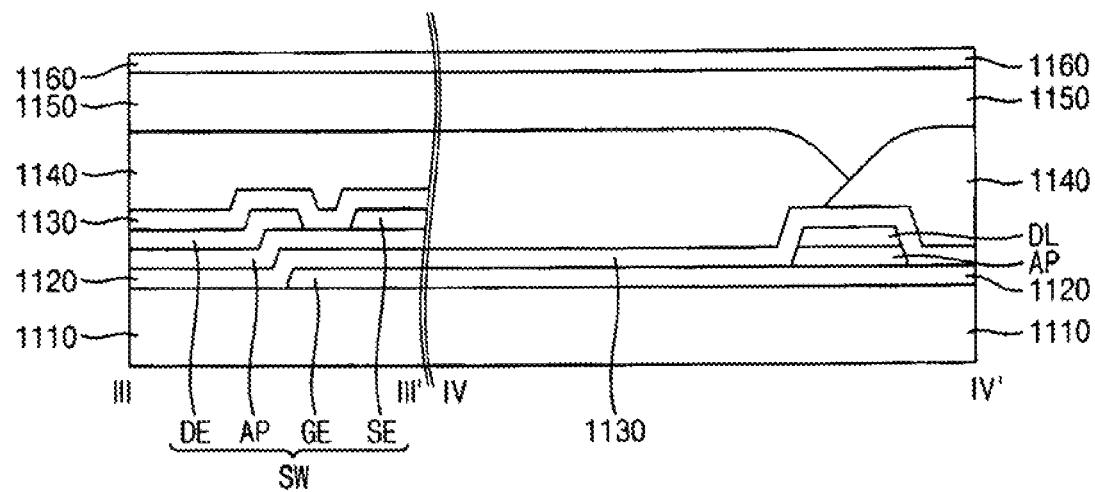

Referring to FIG. 16, according to a present exemplary embodiment, the common electrode 1160 is formed on the base substrate 1110 on which the organic layer 1150 is formed.

According to a present exemplary embodiment, the common electrode 1160 is formed on the organic layer 1150. The common electrode 1160 includes a transparent conductive material such as indium tin oxide (ITO) or indium zinc oxide (IZO). In addition, the common electrode 1160 may include titanium (Ti) and/or molybdenum titanium (MoTi). A common voltage can be applied to the common electrode 1160.

Figure 17:
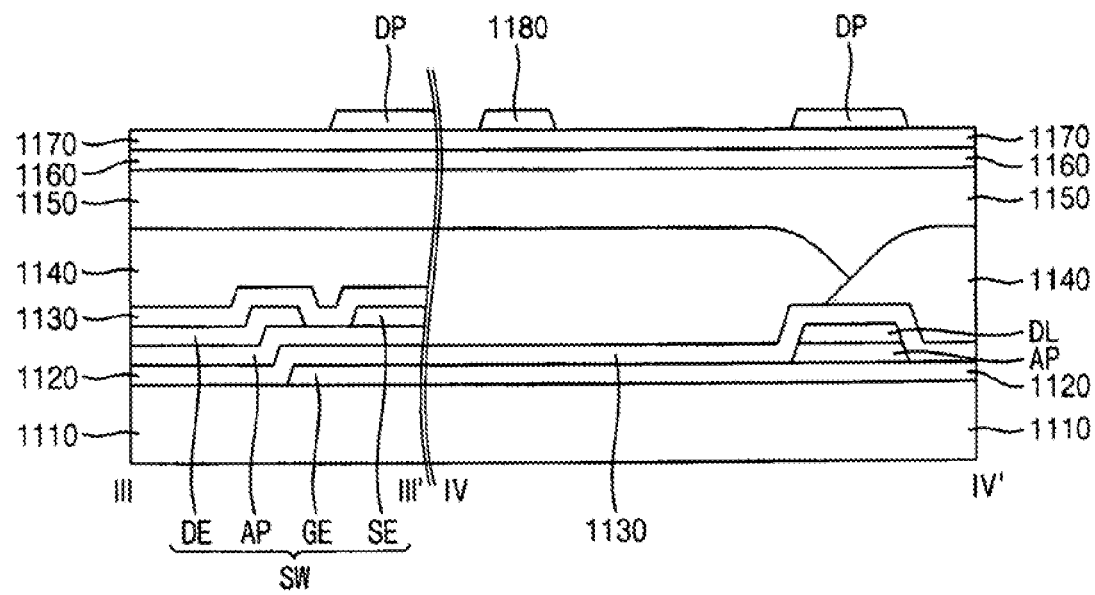

Referring to FIG. 17, according to a present exemplary embodiment, the third insulation layer 1170 is formed on the base substrate 1110 on which the common electrode 1160 is formed. Then, the pixel electrode 1180 and the dummy pattern DP are formed on the third insulation layer 1170.

According to a present exemplary embodiment, the third insulation layer 1170 is formed on the common electrode 1160. The third insulation layer 1170 includes an inorganic material such as silicon oxide (SiOx) and/or silicon nitride (SiNx). For example, the third insulation layer 1170 includes silicon oxide (SiOx) and has a thickness of about 500 Å. In addition, the third insulation layer 1170 may include a plurality of layers that include different materials.

According to a present exemplary embodiment, the pixel electrode 1180 is formed on the third insulation layer 1170. The pixel electrode 1180 includes a transparent conductive material such as indium tin oxide (ITO) or indium zinc oxide (IZO). In addition, the pixel electrode 1180 may include titanium (Ti) and/or molybdenum titanium (MoTi). The pixel electrode 1180 is slit-shaped. The pixel electrode 1180 overlaps the common electrode 1160. Thus, by applying an electric field to the pixel electrode 1180 and the common electrode 1160, horizontally-arranged liquid crystals rotate so that a desired image can be displayed.

According to a present exemplary embodiment, the dummy pattern DP is formed on the third insulation layer 1170. The dummy pattern DP overlaps the data line DL. The dummy pattern DP is disposed on a same layer as the pixel electrode 1180. The dummy pattern DP includes substantially the same material as the pixel electrode 1180. The dummy pattern DP includes a transparent conductive material such as indium tin oxide (ITO) or indium zinc oxide (IZO). In addition, the dummy pattern DP may include titanium (Ti) and/or molybdenum titanium (MoTi). In a present exemplary embodiment, the width of the dummy pattern DP is greater than the width of the data line DL.

Figure 18:
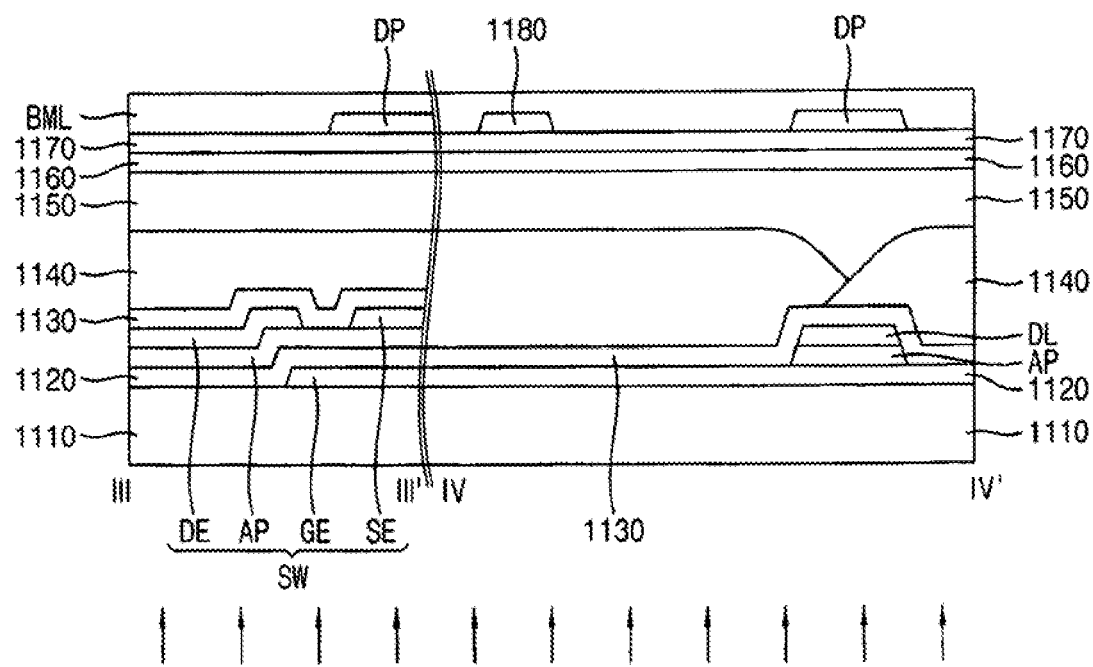

Referring to FIG. 18, according to a present exemplary embodiment, a light-blocking layer BML is formed on the base substrate 1110 on which the pixel electrode 1180 and the dummy pattern DP are formed. Then, the gate metal pattern and the data metal pattern are used as a mask for a back exposure.

According to a present exemplary embodiment, the light-blocking layer BML includes a positive photonasty material. A positive photonasty material reacts to light so that an exposed area becomes soluble to a developer and a blocked area remains insoluble to the developer. Thus, a portion of the light-blocking layer BML formed on an area which does not overlap the gate metal pattern and the data metal pattern is exposed to be dissolved and removed, and another portion of the light-blocking layer BML formed on an area which overlaps the gate metal pattern and the data metal pattern is not exposed and remains.

Referring to FIG. 11, according to a present exemplary embodiment, a light-blocking pattern is formed by developing the light-blocking layer BML.

According to a present exemplary embodiment, the light-blocking pattern includes the data light-blocking pattern DBM and the gate light-blocking pattern GBM.

According to a present exemplary embodiment, the data light-blocking pattern DBM is formed directly on the dummy pattern DP. The width of the data light-blocking pattern DBM is substantially the same as that of the data line DL. The data light-blocking pattern DBM includes a positive photonasty material. The data light-blocking pattern DBM extends in a direction substantially the same as that of the data line DL.

According to a present exemplary embodiment, the gate light-blocking pattern GBM is integrally formed with the data light-blocking pattern DBM. The gate light-blocking pattern GBM overlaps the gate line GL, the gate electrode GE, the source electrode SE and the drain electrode DE. The gate light-blocking pattern GBM includes a material substantially the same as that of the data light-blocking pattern DBM. The gate light-blocking pattern GBM includes a positive photonasty material.

Figure 19:
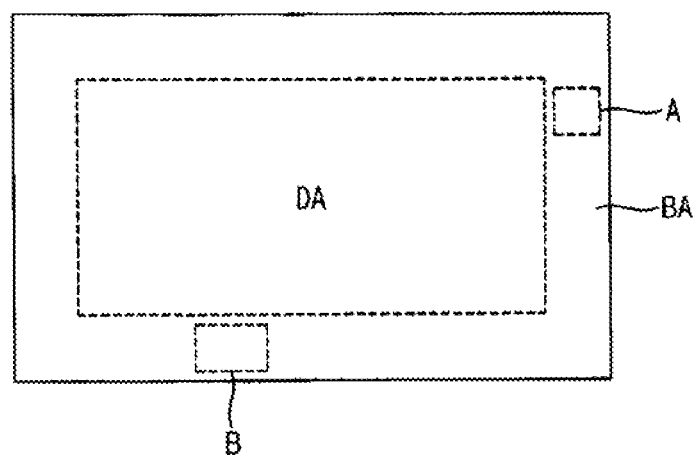
FIG. 19 is a plan view that illustrates a display substrate according to exemplary embodiments of the inventive concept.
Figure 20:
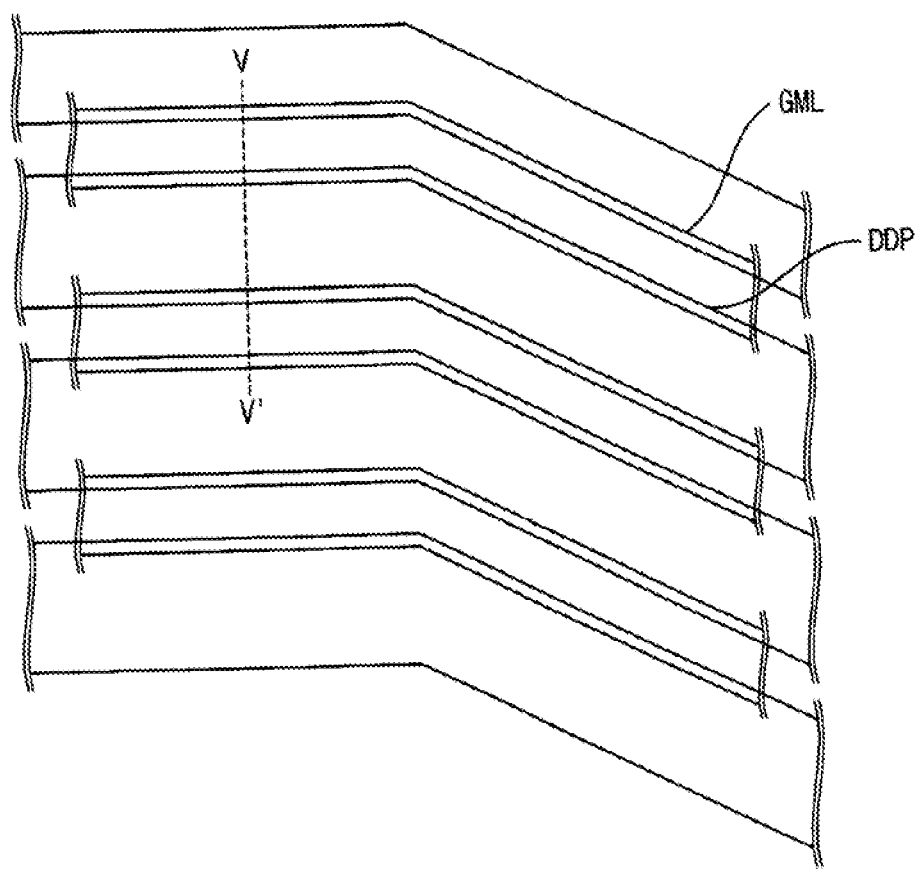
FIG. 20 is a plan view that magnifies portion 'A' of FIG. 19.
Figure 21:
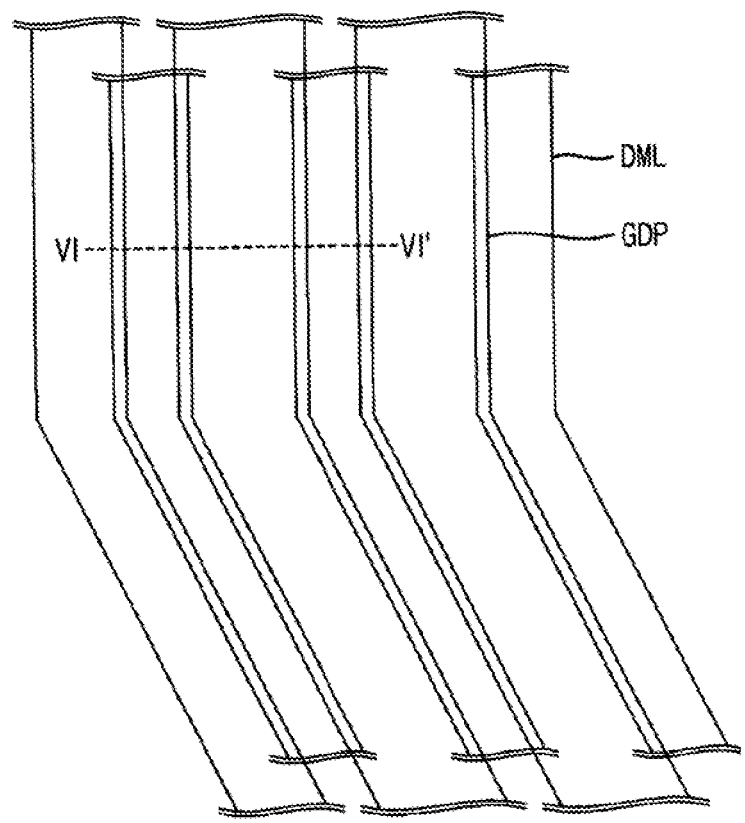
FIG. 21 is a plan view that magnifies portion 'B' of FIG. 19.
Figure 22:
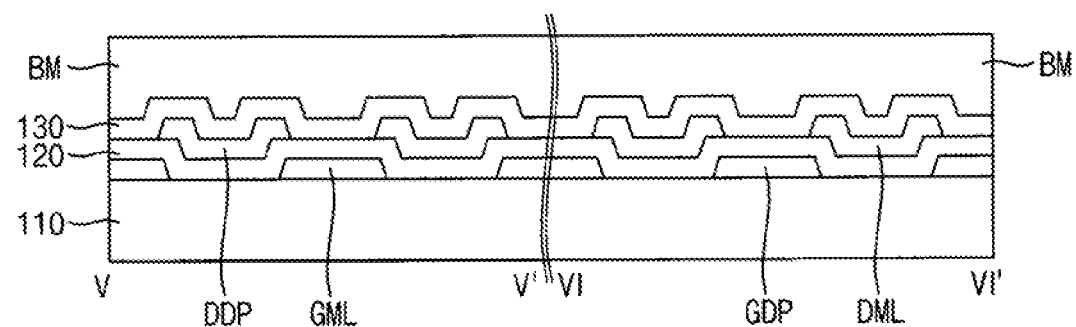
FIG. 22 is a cross-sectional view taken along line V-V' of FIG. 20 and line VI-VI' of FIG. 21.

FIG. 19 is a plan view that illustrates a display substrate according to exemplary embodiments of the inventive concept. FIG. 20 is a plan view that magnifies portion 'A' of FIG. 19. FIG. 21 is a plan view that magnifies portion 'B' of FIG. 19. FIG. 22 is a cross-sectional view taken along line V-V' of FIG. 20 and line VI-VI' of FIG. 21.

Referring to FIGS. 19 to 22, a display substrate according to a present exemplary embodiment includes a display area DA and a light-blocking area BA. A light-blocking pattern is formed in the light-blocking area BA so that lines disposed around the display area DA can be invisible.

A display substrate according to a present exemplary embodiment includes a gate metal line GML and a data metal line DML. The gate metal line GML is disposed on the light-blocking area BA and is connected to the gate line. The data metal line DML is disposed on the light-blocking area BA and is connected to the data line. The gate metal line GML connects the gate line and a gate pad part (not shown). The data metal line DML connects the data line and a data pad part (not shown).

A display substrate according to a present exemplary embodiment includes a gate dummy pattern GDP and a data dummy pattern DDP. The gate dummy pattern GDP partially overlaps the data metal line DML and is disposed on a same layer as the gate line GL. The data dummy pattern DDP partially overlaps the gate metal line GML and is disposed on a same layer as the data line DL. The gate dummy pattern GDP totally covers a space between each data metal line DML in a plan view. The data dummy pattern DDP totally covers a space between each gate metal line GML in a plan view.

According to a present exemplary embodiment, an external light-blocking pattern BM is formed in the light-blocking area BA. The external light-blocking pattern BM includes a positive photonasty material, and is formed by a back exposure. Thus, the external light-blocking pattern BM can be formed in the light-blocking area BA, totally covering the gate dummy pattern GDP and the data metal line DML and the data dummy pattern DDP and the gate metal line GML in a plan view.

Figure 23:
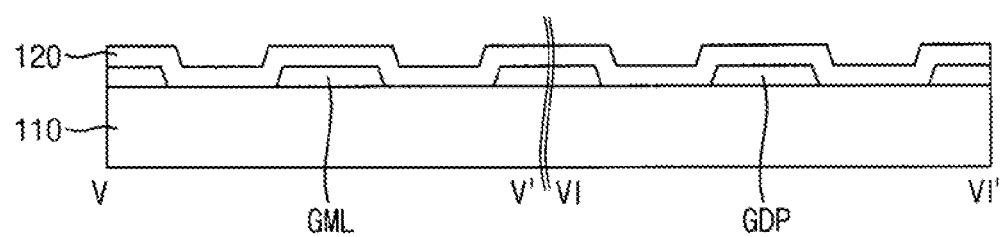
FIGS. 23 to 25 are cross-sectional views that illustrate a method of manufacturing the display substrate of FIG. 22.
Figure 24:
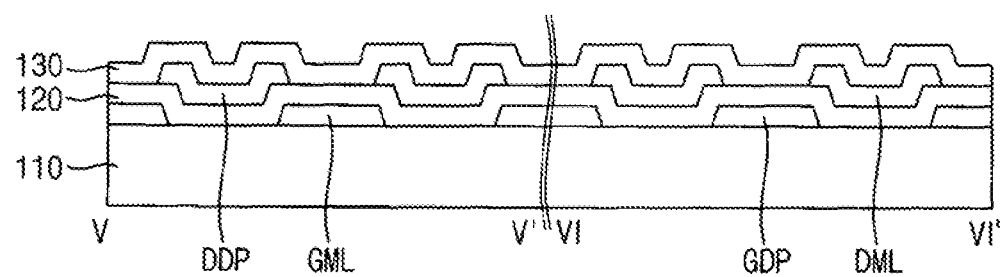
Figure 25:
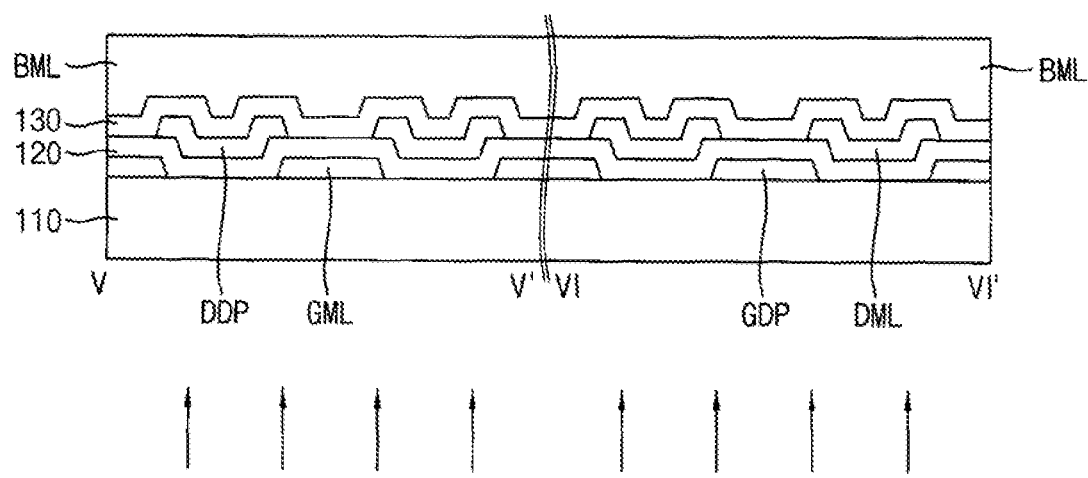

FIGS. 23 to 25 are cross-sectional views illustrating a method of manufacturing the display substrate of FIG. 22.

Referring to FIG. 23, according to a present exemplary embodiment, the gate metal line GML and the gate dummy pattern GDP are formed on a base substrate 110. Then, a first insulation layer 120 is formed on a base substrate 110 on which the gate metal line GML and the gate dummy pattern GDP are formed.

According to a present exemplary embodiment, a gate metal layer is formed on the base substrate 110, and the gate metal layer is patterned to form the gate metal line GML and the gate dummy pattern GDP. A glass substrate, a quartz substrate, a silicon substrate, a plastic substrate, etc., can be used as the base substrate 110.

According to a present exemplary embodiment the gate metal layer includes copper (Cu), silver (Ag), chrome (Cr), molybdenum (Mo), aluminum (Al), titanium (Ti), manganese (Mn), aluminum (Al), or an alloy thereof. The gate metal layer may have a single layer structure or a multi layer structure with a plurality of different metal layers. For example, the gate metal layer includes a copper layer and a titanium layer formed on an upper or a lower surface of the copper layer.

According to a present exemplary embodiment, the gate metal line GML and the gate dummy pattern GDP are formed on a same layer as the gate line GL and the gate electrode GE.

Next, according to a present exemplary embodiment, the first insulation layer 120 is formed to cover the gate metal line GML and the gate dummy pattern GDP. The first insulation layer 120 includes silicon nitride, silicon oxide, etc. The first insulation layer 120 may have a single layer structure or a multi layer structure. For example, the first insulation layer 120 includes a lower insulation layer having silicon nitride and an upper insulation layer having silicon oxide.

Referring to FIG. 24, according to a present exemplary embodiment, the data metal line DML and the data dummy pattern DDP are formed on the base substrate 110 on which the first insulation layer 120 is formed. The data metal line DM L and the data dummy pattern DDP are formed on a same layer as the data line DL, the source electrode SE, the drain electrode DE.

According to a present exemplary embodiment, the second insulation layer 130 is formed on the data metal line DML and the data dummy pattern DDP. The second insulation layer 130 includes an inorganic material. For example, the second insulation layer 130 may include silicon oxide (SiOx) or silicon nitride (SiNx). For example, the second insulation layer 130 includes silicon oxide (SiOx) and m has a thickness of about 500 Å. In addition, the second insulation layer 130 may have a multi layer structure that includes different materials.

Referring to FIG. 25, according to a present exemplary embodiment, a light-blocking layer BML is formed on the base substrate 110 on which the second insulation layer 130 is formed. Then, a gate metal pattern and a data metal pattern are used as a mask for a back exposure.

According to a present exemplary embodiment, the light-blocking layer BML includes a positive photonasty material. A positive photonasty material reacts to light so that an exposed area becomes soluble to a developer and a blocked area remains insoluble to the developer. Thus, a portion of the light-blocking layer BML formed on an area which does not overlap the gate metal pattern and the data metal pattern is exposed to be dissolved and removed, and another portion of the light-blocking layer BML formed on an area which overlaps the gate metal pattern and the data metal pattern is not exposed and remains.

Referring to FIG. 22, according to a present exemplary embodiment, a light-blocking pattern is formed by developing the light-blocking layer BML.

According to a present exemplary embodiment, an external light-blocking pattern BM is formed in the light-blocking area BA. The external light-blocking pattern BM includes a positive photonasty material, and is formed by back exposure. Thus, the external light-blocking pattern BM can be formed in the light-blocking area BA, totally covering the gate dummy pattern GDP and the data metal line DML and the data dummy pattern DDP and the gate metal line GML in a plan view.

According to exemplary embodiments of the inventive concept, a display substrate includes a data light-blocking pattern that overlaps a data line. Thus, defects such as an uneven display due to interference of light reflected by the data line can be reduced.

In addition, the data light-blocking pattern includes a positive photonasty material and is formed by a back exposure. Accordingly, a data light-blocking pattern can be formed with substantially the same width as the data line. Thus, defects can be reduced without a loss of transmittance.

The foregoing is illustrative of embodiments of the present inventive concept and is not to be construed as limiting thereof. Although a few exemplary embodiments of the present inventive concept have been described, those skilled in the art will readily appreciate that many modifications are possible in exemplary embodiments without materially departing from the novel teachings of the present inventive concept. Therefore, it is to be understood that the foregoing is illustrative of embodiments of the present inventive concept and is not to be construed as limited to specific exemplary embodiments disclosed, and that modifications to disclosed exemplary embodiments, as well as other exemplary embodiments, are intended to be included within the scope of the appended claims. The present inventive concept is defined by the following claims, with equivalents of the claims to be included therein.

What is claimed is:

1. A method of manufacturing a display substrate, the method comprising:
    forming a gate metal pattern on a base substrate, wherein the gate metal pattern includes a gate line and a gate electrode;
    forming a data metal pattern on the base substrate, wherein the data metal pattern includes a data line, a source electrode and a drain electrode;
    forming a color filter layer on the data metal pattern;
    forming a first electrode on the color filter layer;
    forming an insulation layer on the first electrode;
    forming a second electrode and a dummy pattern on the insulation layer, wherein the second electrode includes a slit and the dummy pattern overlaps the data line;

forming a light-blocking layer on the dummy pattern;

exposing the light-blocking layer in a direction from the data line to the dummy pattern; and developing the exposed light-blocking layer to form a light-blocking pattern.

2. The method of claim 1, wherein the dummy pattern comprises substantially the same material as the second electrode.

3. The method of claim 2, wherein a width of the dummy pattern is less than a width of the data line and a width of the light-blocking pattern.

4. The method of claim 2, wherein a width of the dummy pattern is greater than a width of the data line and a width of the light-blocking pattern.

5. The method of claim 1, wherein the light-blocking layer includes a positive photonasty material.

6. The method of claim 1, wherein forming the gate metal pattern comprises forming a gate metal line on a light-blocking area of the base substrate, wherein the gate metal line is electrically connected to the gate line, and forming the data metal pattern comprises forming a data metal line on the light-blocking area of the base substrate, wherein the data metal line is electrically connected to the data line.

7. The method of claim 6, wherein forming the data metal pattern comprises forming a data dummy pattern that partially overlaps the gate metal line wherein data dummy pattern is disposed on substantially the same layer as the data line, wherein the data dummy pattern covers an entire space between each gate metal line in a plan view.

8. The method of claim 6, wherein forming the gate metal pattern comprises forming a gate dummy pattern that partially overlaps the data metal line wherein the gate dummy pattern is disposed on substantially the same layer as the gate line, wherein the gate dummy pattern covers an entire space between each data metal line in a plan view.

9. The method of claim 1, wherein the second electrode is electrically connected to the drain electrode.

* * * * *